United States Patent

Barnett et al.

[15] 3,703,656

[45] Nov. 21, 1972

[54] MONOLITHIC SEMICONDUCTOR DISPLAY DEVICES

[72] Inventors: Allen M. Barnett; Simeon V. Galginaitis, both of Schenectady; Frederick K. Heumann, Burnt Hills, all of N.Y.

[73] Assignee: General Electric Company

[22] Filed: Feb. 17, 1971

[21] Appl. No.: 116,005

[52] U.S. Cl. ............................................ 313/108 D

[51] Int. Cl. ............................................ H01j 1/62

[58] Field of Search .313/108 D, 109.5; 315/169 TV, 315/169 R; 317/235 N

[56] References Cited

UNITED STATES PATENTS

| | | | |
|---|---|---|---|
| 3,473,032 | 10/1969 | Lehovec | 313/108 D |
| 3,501,676 | 3/1970 | Adler et al. | 315/169 R |
| 3,517,258 | 6/1970 | Lynch | 315/169 R |
| 3,499,158 | 3/1970 | Lavine et al. | 317/235 N |
| 2,911,539 | 11/1959 | Tanenbaum | 317/235 N |

OTHER PUBLICATIONS arinace et al., "Electroluminescent Diodes and Arrays" IBM Technical Disclosure Bulletin, Vol. 8, No. 11, April 1966, pp. 1664, 1665.

*Primary Examiner*—Roy Lake
*Assistant Examiner*—James B. Mullins
*Attorney*—Paul A. Frank, John F. Ahern, Jerome C. Squillaro, Frank L. Neuhauser, Oscar B. Waddell and Joseph B. Forman

[57] ABSTRACT

Monolithic semiconductor arrays of light-emitting diodes and methods for making them on optically transparent semi-insulating substrates, for example, with means for providing optical isolation between adjacent diodes are described. In one embodiment, a monolithic matrix-addressable alphanumeric display device is formed by selective liquid epitaxial growth of n- and p-type gallium phosphide semiconductor material on a semi-insulating substrate of gallium phosphide, for example. Optical isolation between adjacent diodes is provided by metallic films alloyed into the major surfaces of the substrate. These metallic films also provide electrical contact to the n- and p-type regions for addressing the display device.

11 Claims, 10 Drawing Figures

Inventors:
Allen. M. Barnett,
Simeon V Galginaitis,
Frederick K. Heymann,
by [signature]
Their Attorney.

MONOLITHIC SEMICONDUCTOR DISPLAY DEVICES

The present invention relates to display devices and more particularly to monolithic semiconductor display devices and methods for making the same. This application is related to our concurrently filed applications Ser. Nos. 116,125 and 116,126, both filed on Feb. 17, 1971, and of common assignee as the instant application and incorporated herein by reference thereto.

Present-day semiconductor display devices generally include discrete light-emitting elements interconnected with electrical wires to perform a desired function. For example, U.S. Pat. No. 3,517,258 describes a display device including light-emitting diodes arranged in columns and rows with means for selectively energizing individual light-emitting diodes. This display device, however, requires numerous electrical interconnections to be made by "flying leads." These flying leads generally include point-to-point contacts between elements by electrical wires bonded to the light-emitting elements in a desired manner. The fabrication of individual light-emitting devices or even groups of light-emitting devices connected in this manner is extremely difficult, very costly and mechanically and electrically unreliable. Further, integrated circuit techniques, generally employed in the fabrication of field-effect transistors, bipolar transistors and other circuit elements have not been adaptable to the fabrication of light-emitting devices primarily because of the inability to form N-type conductivity diffused regions coplanar with the surface of semiconductor materials useful for light-emitting devices. For example, in the case of gallium phosphide, suitable donor-type diffusants are unavailable. Hence, truly monolithic planar processing techniques, such as those used in silicon, for example, are unavailable for the fabrication of semiconductor light-emitting devices of gallium phosphide, for example.

It is therefore an object of this invention to provide planar monolithic arrays of light-emitting diodes.

It is another object of this invention to provide matrix-addressable monolithic display devices and method for making the same.

It is still another object of this invention to provide a monolithic array of light-emitting devices which are electrically and optically isolated from each other.

It is yet another object of this invention to provide a monolithic matrix-addressable display device on a single planar surface of an optically transparent substrate.

Briefly, and in accord with one embodiment of our invention, these and other objects are achieved by embedding a plurality of N-type conductivity stripes in one surface of semi-insulating substrate, such as gallium phosphide, for example, and forming a plurality of P-type conductivity stripes orthogonal to the N-type stripes and in electrical contact therewith. A P-N light-emitting junction or diode is formed at each intersection of a P and N stripe, thereby forming an array of matrix-addressable light-emitting diodes. Electrical contacts and optical isolation between adjacent diodes is provided by a high conductivity film formed over the P-type stripes, by alloying, for example. The high conductivity film includes openings or windows formed therein for light emission from each diode. The opposite surface (back side) of the semi-insulating substrate is lapped to expose portions of the N-type stripes so that electrical contact can be made thereto for addressing the array. Electrical contact to the n-type stripes is provided by a pattern of contacts similar to those of the N-type stripes and formed on a supporting substrate. The pattern of contacts to the N-type stripes also absorb light from the diodes and hence, in concert with the high conductivity film overlying the P-type stripes, provide optical isolation between adjacent diodes. Wires are then bonded to each P-type stripe so that each row and column can be individually addressed.

These and other novel characteristics of our invention are set forth in the appended claims. The invention itself, therefore, may be understood with reference to the following detailed description taken in connection with the accompanying drawing in which:

Figures 1, 2, 3, 4, 5, 6, 7, 8, 9, 10:
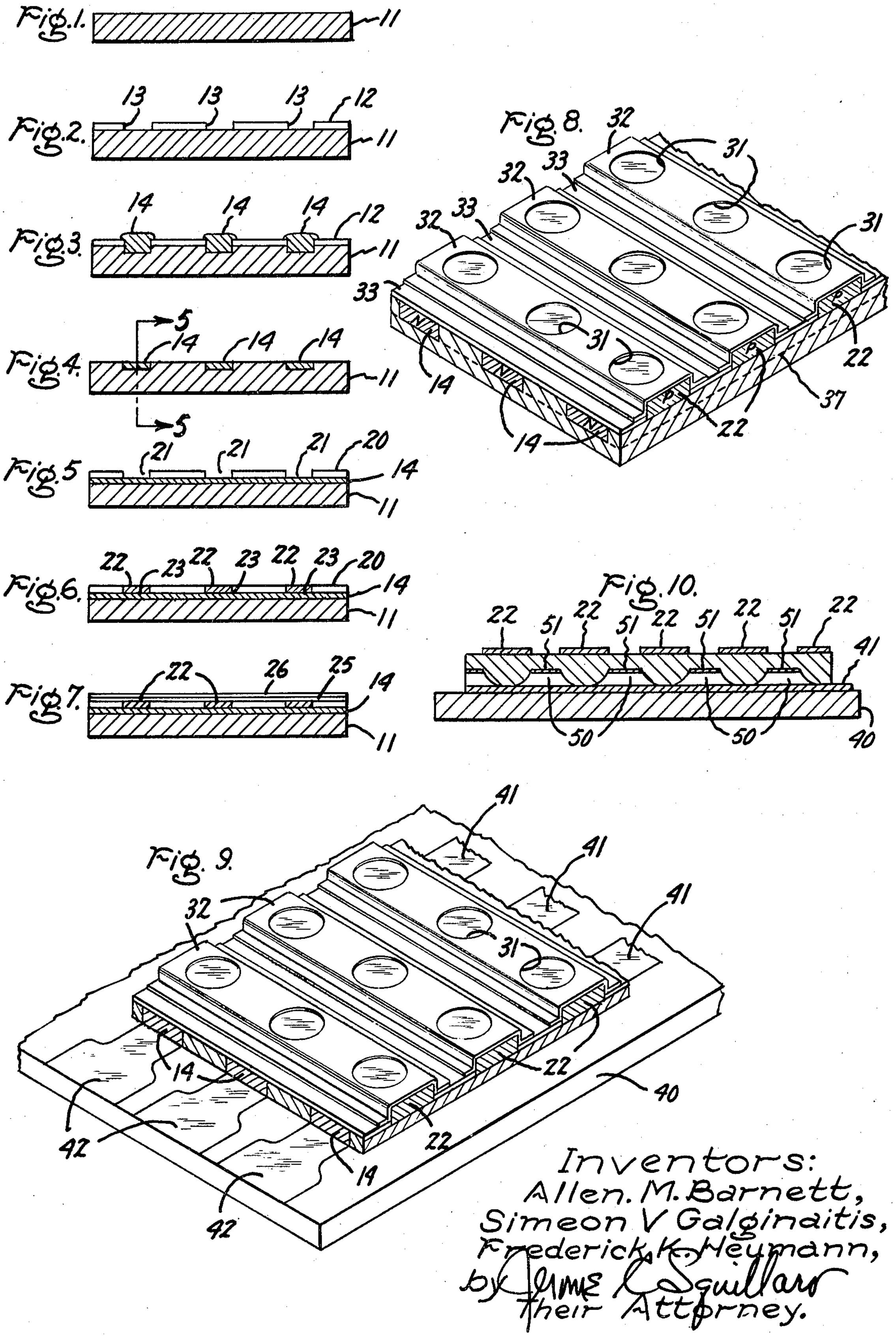
FIGS. 1 through 7 are schematic cross-sectional views of the steps of fabricating a matrix-addressable array in accord with one embodiment of our invention.
FIG. 8 is a partial perspective view of an array of light-emitting diodes fabricated in accord with one embodiment of our invention.
FIG. 9 is a partial perspective view of a matrix-addressable array of light-emitting diodes mounted on a supporting structure.
FIG. 10 is a partial cross-sectional view of a matrix-addressable array taken along an N-type stripe of FIG. 9 wherein a higher external efficiency of light emission is provided.

The fabrication of a monolithic matrix-addressable display device, for example, in accord with one embodiment of our invention is commenced with the selection of a suitable substrate 11 such as, for example, a wafer of undoped or semi-insulating gallium phosphide or gallium arsenide, for example, as cut from a pulled single crystal ingot or grown by a vapor phase epitaxy process, for example. FIG. 1 illustrates such a substrate with its major crystallographic surface oriented along the [111] plane which provides an exceptionally good surface for subsequent liquid phase epitaxial growth.

Next, the substrate 11 is provided with a masking layer, such as silicon dioxide, silicon nitride, silicon oxynitride or other useful masking films which tend to inhibit epitaxial growth on their surface. For purposes of illustration, a silicon dioxide film having a thickness of approximately 2,500 Angstroms is formed over the surface of the semi-insulating substrate 11 by pyrolytic deposition, for example. A plurality of substantially parallel grooves 13 are then etched through the masking layer by photolithographic masking and etching techniques, to expose the surface of the semi-insulating substrate in the etched portions of the masking layer. Typically, the parallel grooves are approximately 10 mils in width on 20 mil centers for this embodiment of our invention.

N-type conductivity stripes 14 of gallium phosphide, for example, are formed in the surface-exposed portions of the semi-insulating substrate 11 by a selective liquid epitaxy process, such as is described in our concurrently filed application Ser. No. 116,125. Briefly, this application describes a process including the preparation of a molten solution of a non-conductivity modifying solvent, the desired amount and type of semiconductor material and suitable conductivity-modifying impurities to produce, at a first temperature, a saturated solution with excess semiconductor material. Epitaxial growth is commenced by immersing the substrate into the saturated solution and then abruptly increasing the solution temperature a few degrees to dissolve the unmasked portions of the substrate and then lowering the temperature of the solution at a programmed rate until the desired epitaxial growth thickness is achieved. Reference is made to the aforementioned application for a more detailed description of this process, if desired. In accord with this process, for example, the surface portion of the semi-insulating substrate is first dissolved to a depth of approximately 2 to 4 mils and then regrowth of the N-type stripe is performed. The result of the epitaxial growth is to provide a plurality of N-type stripes 14 at least partially embedded in the semi-insulating substrate 11. FIG. 3 illustrates a cross-sectional view of these stripes wherein the dissolution and subsequent regrowth are clearly depicted.

After forming the N-type stripes as described above, the surface of the substrate is lapped and polished so that the exposed surface of the N-type stripes are substantially parallel or planar with the semi-insulating substrate, as illustrated in FIG. 4. Next, the substrate is again masked with a suitable masking material 20, such as described above, and a second pattern of grooves 21 substantially perpendicular to the N-type stripes is provided. Typically, this may be achieved by employing a silicon dioxide mask having a thickness of approximately 3,500 Angstroms and using photolithographic masking and etching techniques. The etched pattern may have grooves 15 mils wide on 20 mil centers. FIG. 5, a cross-sectional view taken along the lines 5—5 of FIG. 4, illustrates a single N-type strip 14 with the patterned masking layer 20 and a plurality of grooves 21 etched therein.

The wafer, as illustrated in FIG. 6, is then subjected to a P-type liquid phase epitaxy growth process wherein P-type material 22, such as gallium phosphide doped with zinc, for example, grows in the grooves 21 of the surface exposed portions of the substrate 11. A process similar to that described above, for example, is advantageously used to grow the P-type stripes. At the intersection of each of the P-type stripes 22 with the N-type stripes 14, a P-N light-emitting junction or diode 23 is formed. The P-type stripes are then lapped to a thickness of approximately 25 microns, for example, to produce a substantially planar monolithic array of light-emitting devices.

In accord with one of the novel characteristics of one embodiment of our present invention, we advantageously employ a monocrystalline semi-insulating substrate of gallium phosphide because of its optical transparency. This characteristic of gallium phosphide increases the external efficiency of or emission (i.e., as measured externally) from the P-N junction, by reducing the amount of light absorbed in the substrate. However, light emitted from the P-N junction may pass through the optically transparent substrate and appear to emanate from one OR more locations on the substrate. This is prevented, however, in accord with another novel aspect of our invention by the selective use of optical absorbers or isolators between the light-emitting devices. In accord with one embodiment of our present invention, this is achieved by the novel use of conducting films alloyed into the semiconductor material. These films not only function as optical absorbers, but also as electrical conductors for addressing the array of light-emitting devices. The use of optical absorbers substantially confines the light emitted from each diode to a discrete location on the array, thereby reducing or substantially eliminating undesirable cross-coupling or light-leakage between adjacent diodes.

FIG. 7 illustrates the formation of an optical absorber as comprising the deposition of a first metallic film 25, such as, for example, a thin layer of gold-zinc, typically having a thickness of 2,000 Angstroms. The first metal film 25 may, for example, be formed by evaporation over the entire surface of the epitaxially grown stripes. A second metallic layer 26, such as nickel typically having a thickness of about 2,000 Angstroms, for example, is formed over the first layer, by electroplating, for example. The first and second metal films are then alloyed into the p-type stripes 22 by heating the wafer to a temperature of approximately 450°C. for about 2 minutes. The resulting alloyed metal film provides a high conductivity ohmic contact to the P-type stripes and also provides optical absorption.

FIG. 8 is a partial perspective view illustrating the N-type stripes 14 embedded in the substrate 11 and the P-type stripes 22 perpendicular to and overlying the N-type stripes 14. The alloyed layers of metallization are then patterned by photolithographic masking and etching techniques, for example, to delineate contacts to each of the P-type stripes and to provide holes or windows 31 through which radiation is emitted from the P-N junctions. FIG. 8 also illustrates high conductivity type stripes 32 overlying the P-type stripes 22 with each stripe electrically isolated from each other stripe by channels 33 etched through the metal films. In accord with the dimensions previously described for the N- and P-type stripes, the holes 31 are typically 10 mils in diameter on 20 mil centers. The holes 31 and channels 33 are formed, for example, by masking the layers of metallization with an etch-resistant mask, such as silicon dioxide or KMER, manufactured by the Eastman Kodak Company, and etching the unmasked portions with aqua regia, for example.

Electrical contacts are made to the N-type conductivity stripes 14 by reducing the thickness of the substrate 11, by lapping, for example, so that the N-type stripes are exposed. The substrate, including several thousand P-N light-emitting diodes, for example, is then cut into individual arrays, such as a 5 × 7 matrix of 35 light-emitting diodes. FIG. 8 illustrates the thickness to which the substrate is reduced by the dashed line 37. Typically, the thickness of the substrate is approximately 4 to 5 mils so that it is self-supporting.

A 5 × 7 array of 35 light-emitting diodes, for example, is advantageously utilized in accord with one embodiment of our invention by alloying the array to a metal plated ceramic support 40, for example, as illustrated in FIG. 9. Typically, the ceramic support 40 is provided with a conductive film, such as a gold-tin alloy with a pattern of conductors 41 etched therein and corresponding dimensionally to those of the N-type stripes 14. The gold-tin alloy pattern of conductors 41 terminate in contact pads 42 for contacting each of the N-type stripes. Advantageously, the N-type stripe connections are made simultaneously with the alloying of the gold-tin to the N-type stripes.

The alloyed contact to each of the N-type stripes provides a high conductivity ohmic contact to the N-type stripes so that the matrix of light-emitting diodes can be addressed by the selective application of voltages to the conductive films overlying the P-type stripes and the N-type stripes, respectively. In addition to providing electrical contact to the N-type stripes, the alloyed conductor stripes provide optical absorption of light emitted from the P-N junctions. The amount of absorption provided by these alloyed conductor stripes and hence the amount of optical isolation between adjacent P-N junctions depends primarily on the width of the N-type alloyed stripes. For example, alloyed stripes having a width of at least approximately one-third the width of the N-type stripes 14 provide sufficient optical isolation for most display purposes while also providing adequate electrical conductivity along the stripes.

The elimination of undesirable optical coupling between adjacent light-emitting diodes by the use of optical absorbers, as provided in the embodiment of our invention illustrated in FIG. 9, however, reduces the external efficiency of light emission. For most applications, this reduction in external efficiency does not alter the wide utility of our invention because the brightness at the surface of the device is not materially reduced. However, if desired, and in accord with another aspect of our invention, it is possible to increase the external efficiency of emission and brightness by appropriate use of the semiconductor substrate as a directional reflector.

FIG. 10, for example, illustrates a cross-sectional view taken along an N-type conductivity stripe 14, for example, wherein the external efficiency of emission is increased by appropriate shaping of the substrate 11 to increase directional reflection. More specifically, FIG. 10 illustrates a first plurality of grooves 50 formed in the lower portion of the substrate 11 substantially orthogonal to the N-type stripes 14 and intermediate the P-type conductivity stripes 22. A second plurality of grooves (not shown) are formed at substantially right angles to the first plurality to form a grid-like pattern therein which essentially surrounds each P-N junction so that the substrate in the region of the P-N junctions is thicker than that of its surroundings. The sharp corners produced by cutting the grooves into the substrate are removed, for example, by etching of the lower surface of the substrate. Since etching solutions generally attack sharp edges or corners at a higher rate than the bulk of the material, the remaining "islands" of material assume 10. generally spherical shape, illustrated in cross-section in FIG. -). Advantageously, the etchant produces a smooth polished surface so that it is highly reflecting. A layer of metallization 51 is then applied at the bottom of each groove 50 and alloyed therein to provide optical absorption and hence optical isolation between adjacent P-N junctions. Suitable metals for this purpose include gold, silver and gold doped with silicon, for example. The metallization 51, however, must be interrupted between each N-type conductivity stripe, to avoid electrically shorting each of the N-type stripes together. This may be achieved by evaporating the layer of metallization 51 through a suitable mask, if desired. Alternately, a uniform layer of metallization may be provided and then masked with silicon dioxide or KMER, for example, and the unmasked portions etched with aqua regia, for example. Electrical contact to each of the N-type conductivity stripes is provided, as described above, by the pattern of conductors 41 on the support 40.

Operationally, radiation leaving the P-N junctions at a great enough angle to strike the spherically shaped reflecting surface immediately below the P-N junction is redirected and emerges from the appropriate hole or window formed in the alloyed surface 32 overlying the P-type stripes. Radiation leaving the junction at small angles, however, will be substantially absorbed by the alloyed material 51 and hence prevent optical coupling between adjacent P-N junctions.

In summary, we have described a novel monolithic semiconductor display device and a method for making the same. The fabrication of substantially planar arrays of light-emitting diodes of Group III–V semiconductor compounds with electrical interconnections formed as an integral part of the array represents a significant advancement in the state of the art. In particular, semiconductor display devices fabricated in accord with our invention eliminate the need for numerous "-flying lead" interconnections associated with prior art display devices employing discrete display elements. Further, the cost of fabrication is significantly reduced since the electrical interconnections are formed as an integral part of the display device. Also, the integrally formed interconnections, being alloyed into the surfaces of the display device, are mechanically and electrically highly reliable. The novel methods for providing optical isolation between adjacently spaced diodes permits fabrication on optically transparent substrates thereby providing display devices with high external efficiency of light emission. Display devices fabricated in accord with our invention are particularly useful for alphanumeric displays including 5 × 7 arrays of diodes interconnected to provide a whole line of characters, for example. The external efficiency of light emission of such displays is further enhanced in accord with another aspect of our invention by the use of directional reflection from the substrate material.

Although our invention is described generally with reference to gallium phosphide and a semi-insulating substrate of gallium phosphide, it is to be understood that this has been done merely for purposes of ease of description, and is not to be construed as a limitation of our invention. For example, other Group III–V semiconductor compounds such as gallium arsenide, gallium aluminum phosphide, and indium phosphide, for example, may also be employed, if desired. Further, our invention may be practiced by different configurations of the N- and P-type stripes. For example, depending upon the requirements of the particular application, the different conductivity stripes may be arranged in a curved, zig-zag or serpentine pattern, for example. Also in addition to semi-insulating substrates, other substrates of selected conductivity-type may be used if desired. Further, by appropriate selection of semiconductor dopants, different color displays or combinations thereof can be fabricated. Obviously, those skilled in the art can appreciate that still other modifications are possible. Accordingly, the appended claims are intended to encompass all such modifications and changes which fall within the true spirit and scope of our invention.

What we claim as new and desire to secure by Letters Patent of the United States is:

1. A display device comprising

A substrate of semiconduction material having a pair of opposed surfaces.

a first plurality of stripes of one conductivity type formed in said substrate, each stripe extending between said opposed surfaces, a second plurality of stripes of said semiconductor material and of opposite conductivity type formed on one of said opposed surfaces, each stripe contacting the stripes of said one conductivity type to form a plurality of light emitting diodes therewith, a first plurality of high conductivity films, each in conductive contact with and substantially covering a major exposed portion of a respective one of said opposite conductivity type stripes, each of said films including a plurality of openings each overlying a respective light emitting diode, a second plurality of high conductivity films each in conductive contact with and covering an exposed portion of a respective one of said one conductivity stripes in the other of said opposed surfaces of said substrate.

2. The combination of claim 1, in which said semiconductor material is selected from the class of Group III–V compounds.

3. The combination of claim 1 in which said semiconductor material is Gallium Phosphide.

4. The combination of claim 1 in which said substrate of semiconductor material is semi-insulating gallium phosphide and in which said one type conductivity is N-type and said other type conductivity is P-type.

5. The combination of claim 1 in which the stripes of said first plurality are linear and parallel and in which the stripes of said second plurality are linear and orthogonally oriented with respect to the stripes of said first plurality.

6. The combination of claim 1 in which each of said stripes is thin and has a pair of major opposed surfaces.

7. The combination of claim 1 in which each of said stripes of said opposite conductivity type are substantially thinner than each of said stripes of said one conductivity type.

8. The combination of claim 1 in which two sets of longitudinal grooves are provided in said other surface of said substrate, each of the grooves of one set located between respective adjacent stripes of said one conductivity type, each of the grooves of the other of said sets located between respective adjacent stripes of said other conductivity type whereby a plurality of reflecting surfaces are formed, each underlying a respective light emitting diode.

9. The combination of claim 8 in which each of the grooves of said one set are metallized and in which each of the grooves of said other set are metallized in segments separated from said stripes of one conductivity type.

10. The combination of claim 1 in which said high conductivity films are alloyed into said semiconductor material.

11. The combination of claim 1 including an insulating support have a planar surface on which are provided a plurality of planar conductors each in conductive contact with a respective stripe of said one conductivity type along the length thereon in said other surface of said substrate.

* * * * *